(12) United States Patent
Rai et al.

(10) Patent No.: US 10,971,873 B2
(45) Date of Patent: Apr. 6, 2021

(54) ELECTRICAL UNIT WITH COOLING MEMBER

(71) Applicant: Lear Corporation, Southfield, MI (US)

(72) Inventors: Rutunj Rai, Canton, MI (US);
Zheyuan Ding, Northville, MI (US);
Aric Anglin, Jackson, MI (US);
Parminder Brar, Windsor (CA)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/592,126

(22) Filed: Oct. 3, 2019

(65) Prior Publication Data

US 2020/0136326 A1     Apr. 30, 2020

Related U.S. Application Data

(60) Provisional application No. 62/753,383, filed on Oct. 31, 2018.

(51) Int. Cl.
*H01R 25/14*     (2006.01)

(52) U.S. Cl.
CPC ................................ *H01R 25/145* (2013.01)

(58) Field of Classification Search
CPC ...... H01R 25/145; H01R 25/162; H01H 9/52; H01H 2033/6613; H01H 45/12
USPC ......................................................... 439/115
See application file for complete search history.

(56) References Cited

U.S. PATENT DOCUMENTS

| | | | |
|---|---|---|---|
| 2,984,080 A * | 5/1961 | Sliepcevich | F17C 13/12 62/46.1 |
| 5,504,378 A | 4/1996 | Lindberg et al. | |
| 7,837,496 B1 * | 11/2010 | Pal | H01R 9/2466 361/712 |
| 8,552,824 B1 * | 10/2013 | Pal | H01H 50/12 335/185 |
| 9,137,925 B2 | 9/2015 | Pal et al. | |
| 9,142,364 B2 * | 9/2015 | Pal | H01H 1/62 |
| 9,153,946 B2 | 10/2015 | Pal | |
| 9,855,903 B1 * | 1/2018 | Pal | H01H 50/12 |
| 9,991,655 B2 * | 6/2018 | Pal | H01R 25/162 |
| 10,057,974 B2 * | 8/2018 | Pal | H05K 1/181 |
| 10,270,231 B2 * | 4/2019 | Pal | H01H 1/62 |
| 2014/0087584 A1 * | 3/2014 | Pal | H02B 1/056 439/485 |
| 2014/0176270 A1 * | 6/2014 | Temnykh | H05G 2/00 335/306 |
| 2016/0172126 A1 * | 6/2016 | Pal | H01H 1/5805 200/292 |

(Continued)

FOREIGN PATENT DOCUMENTS

JP     5621882 B2     11/2014

*Primary Examiner* — Harshad C Patel
(74) *Attorney, Agent, or Firm* — Fishman Stewart PLLC

(57) ABSTRACT

An electrical unit includes a contactor having a housing member, a first terminal, a second terminal, and/or a contact member disposed in the housing member and configured to selectively electrically connect the first terminal and the second terminal. The electrical unit may include a cooling member connected to the housing member, a first bus bar connected to the cooling member and the first terminal, and/or a second bus bar connected to the cooling member and the second terminal. The cooling member may be configured to dissipate heat that is generated via electrical current flowing through the contact member.

20 Claims, 10 Drawing Sheets

(56) References Cited

U.S. PATENT DOCUMENTS

| | | | |
|---|---|---|---|
| 2017/0076877 A1* | 3/2017 | Pal | H01H 50/12 |
| 2017/0279250 A1* | 9/2017 | Pal | H02B 1/20 |
| 2018/0009399 A1 | 1/2018 | Pal | |
| 2018/0330906 A1* | 11/2018 | Hiramitsu | H01H 45/12 |
| 2018/0366922 A1* | 12/2018 | Pal | H01H 9/52 |
| 2019/0214799 A1* | 7/2019 | Pal | H01H 50/12 |

* cited by examiner

ELECTRICAL UNIT WITH COOLING MEMBER

CROSS-REFERENCE TO RELATED APPLICATION

This application claims the benefit of U.S. Provisional Patent Application Ser. No. 62/753,383, filed on Oct. 31, 2018, the disclosure of which is hereby incorporated by reference in its entirety as though fully set forth herein.

TECHNICAL FIELD

The present disclosure generally relates to electrical units, including contactors that may be used in connection with large electrical currents.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical units are not configured for use with large electrical currents and some electrical units may not be configured to sufficiently dissipate heat generated via large electrical currents.

There is a desire for solutions/options that minimize or eliminate one or more challenges or shortcomings of electrical units. The foregoing discussion is intended only to illustrate examples of the present field and is not a disavowal of scope.

SUMMARY

In embodiments, an electrical unit may include a contactor having a housing member, a first terminal, a second terminal, and/or a contact member disposed in the housing member and configured to selectively electrically connect the first terminal and the second terminal. The electrical unit may include a cooling member connected to the housing member, a first bus bar connected to the cooling member and the first terminal, and/or a second bus bar connected to the cooling member and the second terminal. The cooling member may be configured to dissipate heat that is generated via electrical current flowing through the contact member. The first terminal, the second terminal, the contact member, the first bus bar, and/or the second bus bar may be configured for a continuous current of at least about 400 amps. The cooling member may include a first mounting portion connected to a first flange of the housing member. The cooling member may include a second mounting portion that may be connected to a second flange of the housing member. The first flange and the second flange may extend from opposite sides of the housing member. The first terminal may be connected to the first bus bar via a first fastener. The second terminal may be connected to the second bus bar via a second fastener. The first mounting portion may be connected to the first flange via a third fastener. The second mounting portion may be connected to the second flange via a fourth fastener.

In examples, a first terminal may be disposed partially in the housing member and partially in the cooling member. The first terminal may be disposed in contact with the first bus bar. A portion of the first terminal may be disposed in the cooling member and may be electrically insulated from the cooling member. The second terminal may be disposed partially in the housing member and partially in the cooling member. The second terminal may be disposed in contact with the second bus bar. A body of the cooling member may be disposed directly on a side of the housing member. The cooling member may be a monolithic component. The cooling member may include a first aperture and a second aperture. The first terminal may be disposed partially in the first aperture. The second terminal may be disposed partially in the second aperture. The first terminal and the second terminal may extend through a wall of the housing member. The cooling member may include a substantially hollow body, a first mounting portion, and/or a second mounting portion. The substantially hollow body, the first mounting portion, and the second mounting portion may be disposed in a substantially C-shaped configuration.

With examples, a cooling member may be electrically insulated from the first bus bar, the second bus bar, the first terminal, and/or the second terminal. A section of the cooling member may be disposed between the first bus bar and the housing member. The cooling member may include a recess. The first bus bar may be disposed partially in a first portion of the recess. The second bus bar may be disposed partially in a second portion of the recess. A first end of the first bus bar may be separated from a first end of the second bus bar by a barrier of electrically insulating and thermally conductive material. A width of the barrier may not be greater than a thickness of the first bus bar. A width of the cooling member may be greater than a width of the housing member. A length of the cooling member may be greater than a length of the housing member. A portion of the cooling member may be disposed substantially between the first terminal and the second terminal. The cooling member may include at least one fin configured for heat dissipation.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
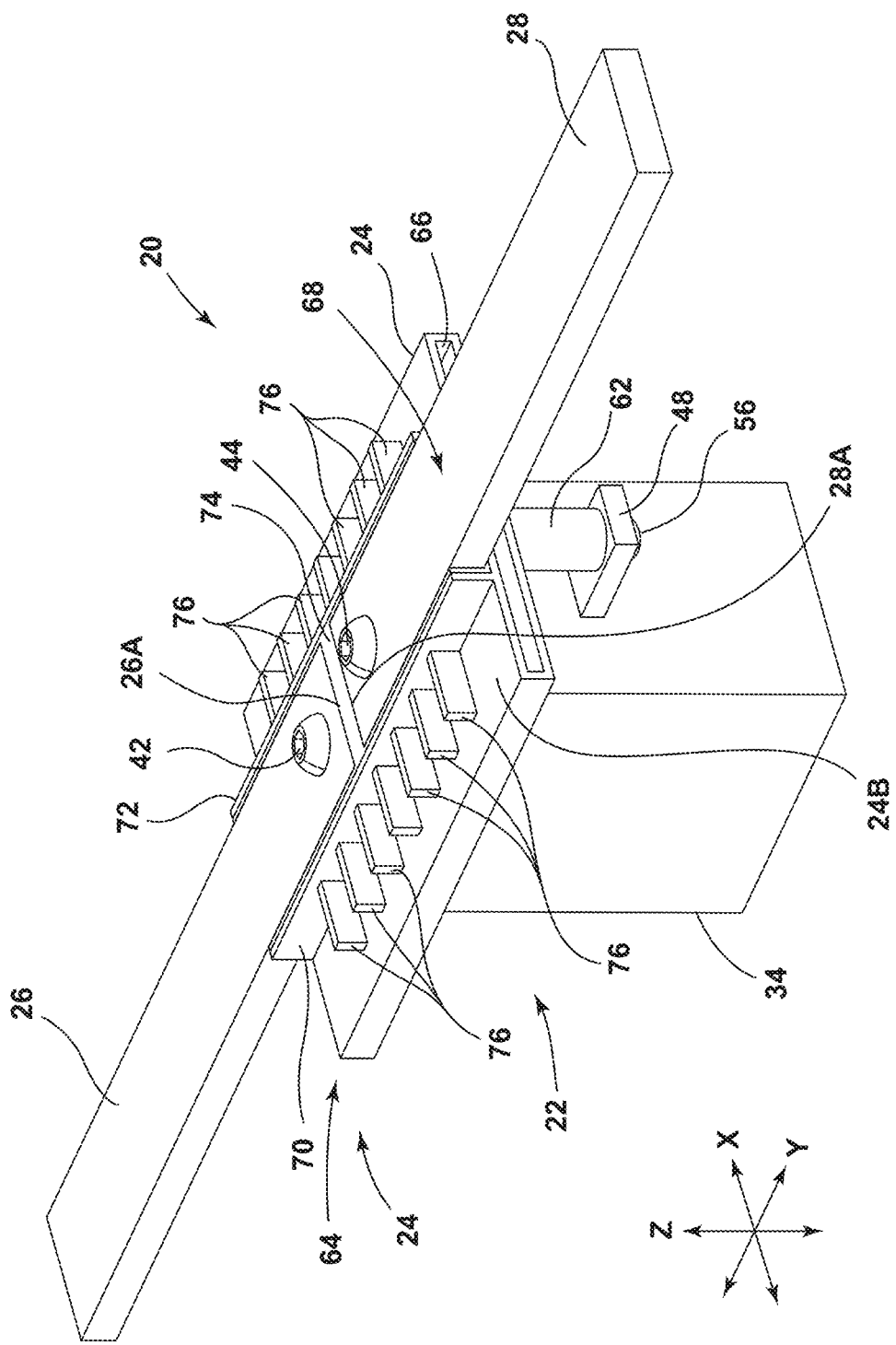
FIGS. 1 and 2 are a perspective view and a side view, respectively, generally illustrating embodiments of electrical units according to teachings of the present disclosure.
Figure 2:
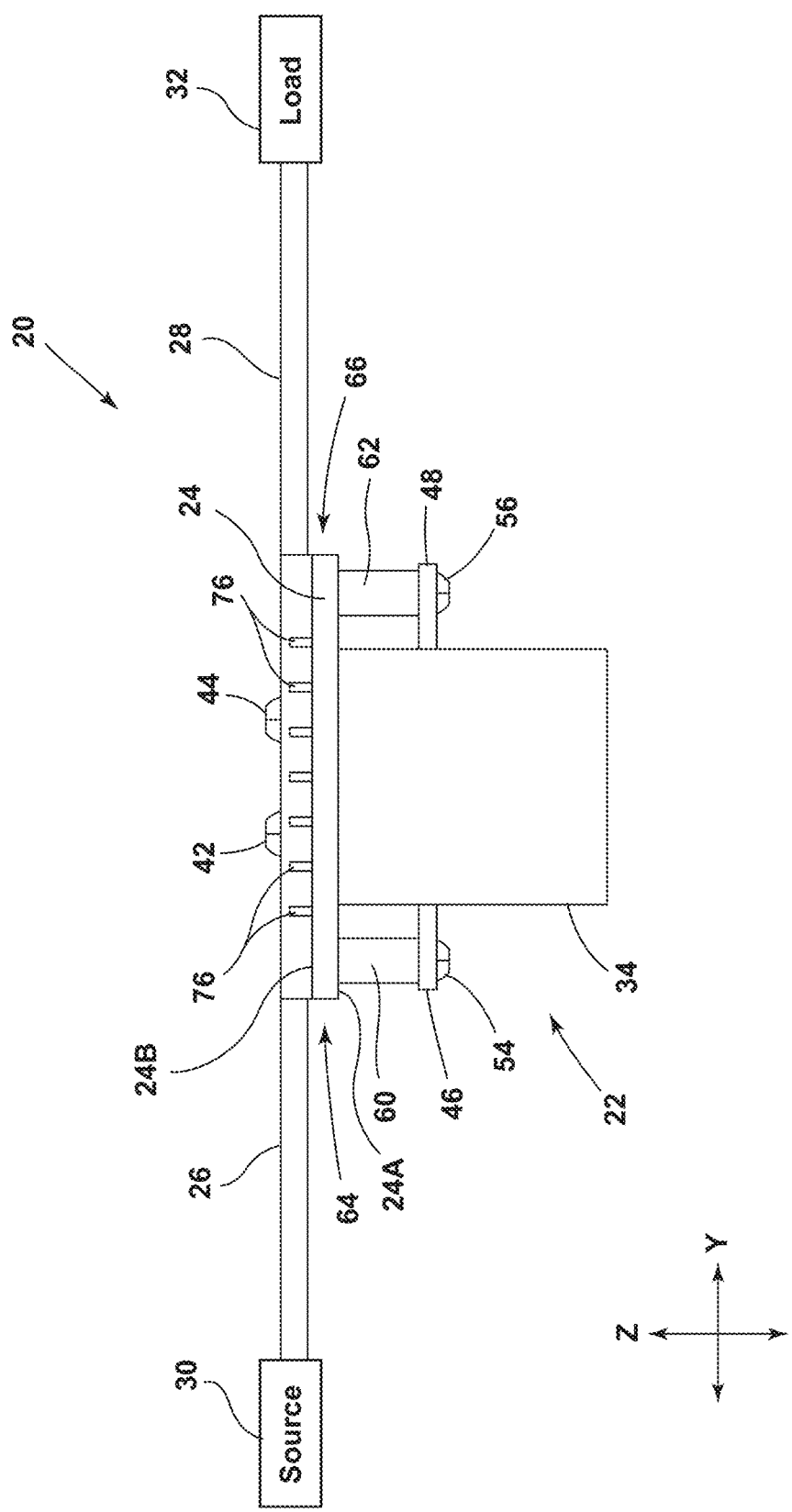

In embodiments, such as generally illustrated in FIGS. 1 and 2, an electrical unit 20 may include a contactor (or relay) 22, a cooling member 24, a first conductor/bus bar 26, and/or a second conductor/bus bar 28. The contactor 22 may be configured to selectively electrically connect the first bus bar 26 with the second bus bar 28. For example and without limitation, the contactor 22 may be configured to selectively provide electrical current from a current source 30 (e.g., an electrical outlet, etc.) that may be connected to one of the bus bars 26, 28 to a load (e.g., a battery, such as a vehicle battery) 32 that may be connected to the other of the bus bars 28, 26 (see, e.g., FIG. 2). The contactor 22, the first bus bar 26, and/or the second bus bar 28 may be configured for large electrical currents. For example and without limitation, the contactor 22, the first bus bar 26, and/or the second bus bar 28 may be configured for a continuous electrical current of at least 400 amps (e.g., for rapid charging applications). Large electrical currents flowing through the bus bars 26, 28 and/or the contactor 22 may generate or result in a large amount of heat. The cooling member 24 may be configured to facilitate dissipation of at least some of the generated heat.

Figure 3:
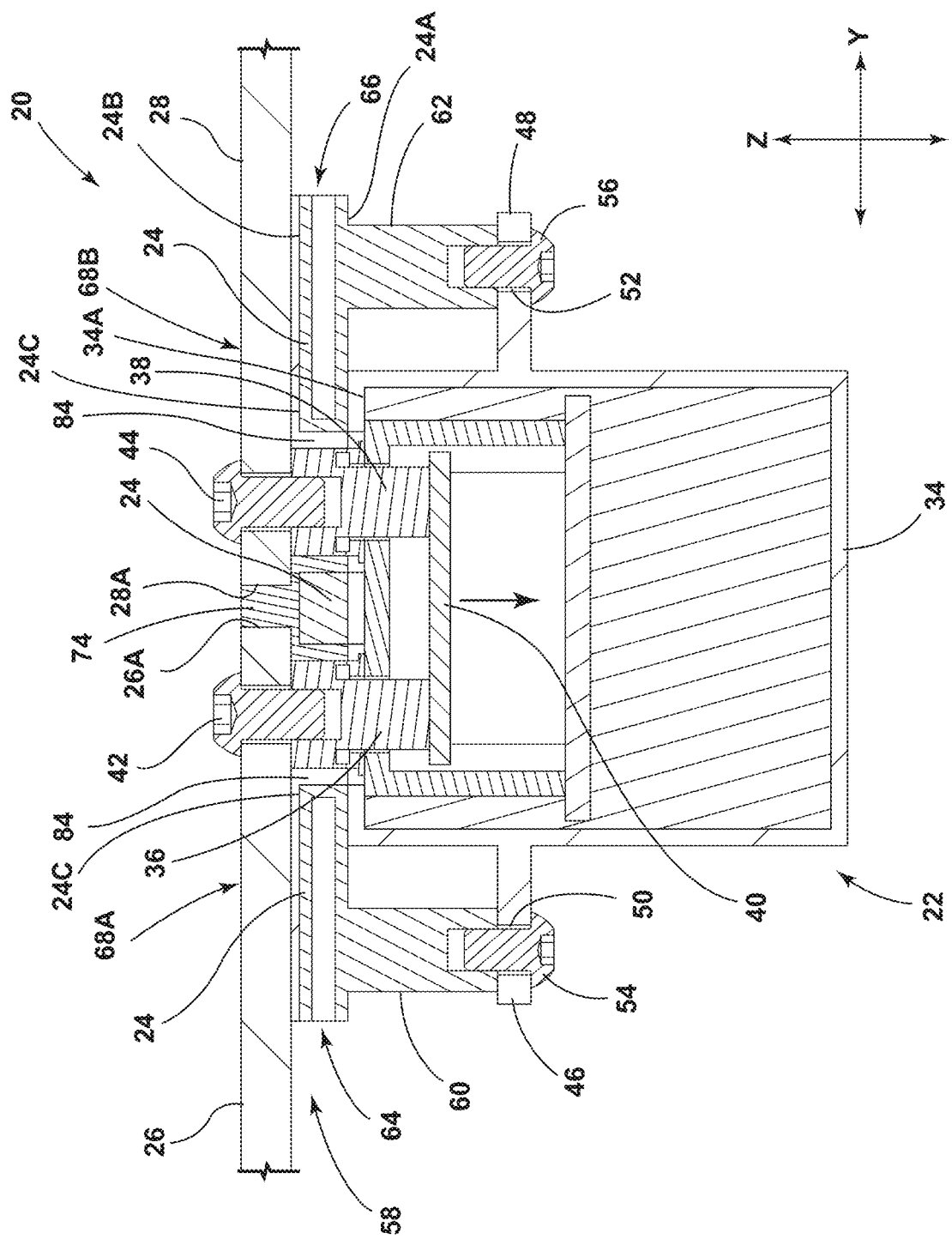
FIGS. 3 and 4 are cross-sectional views generally illustrating embodiments of electrical units according to teachings of the present disclosure.
Figure 4:
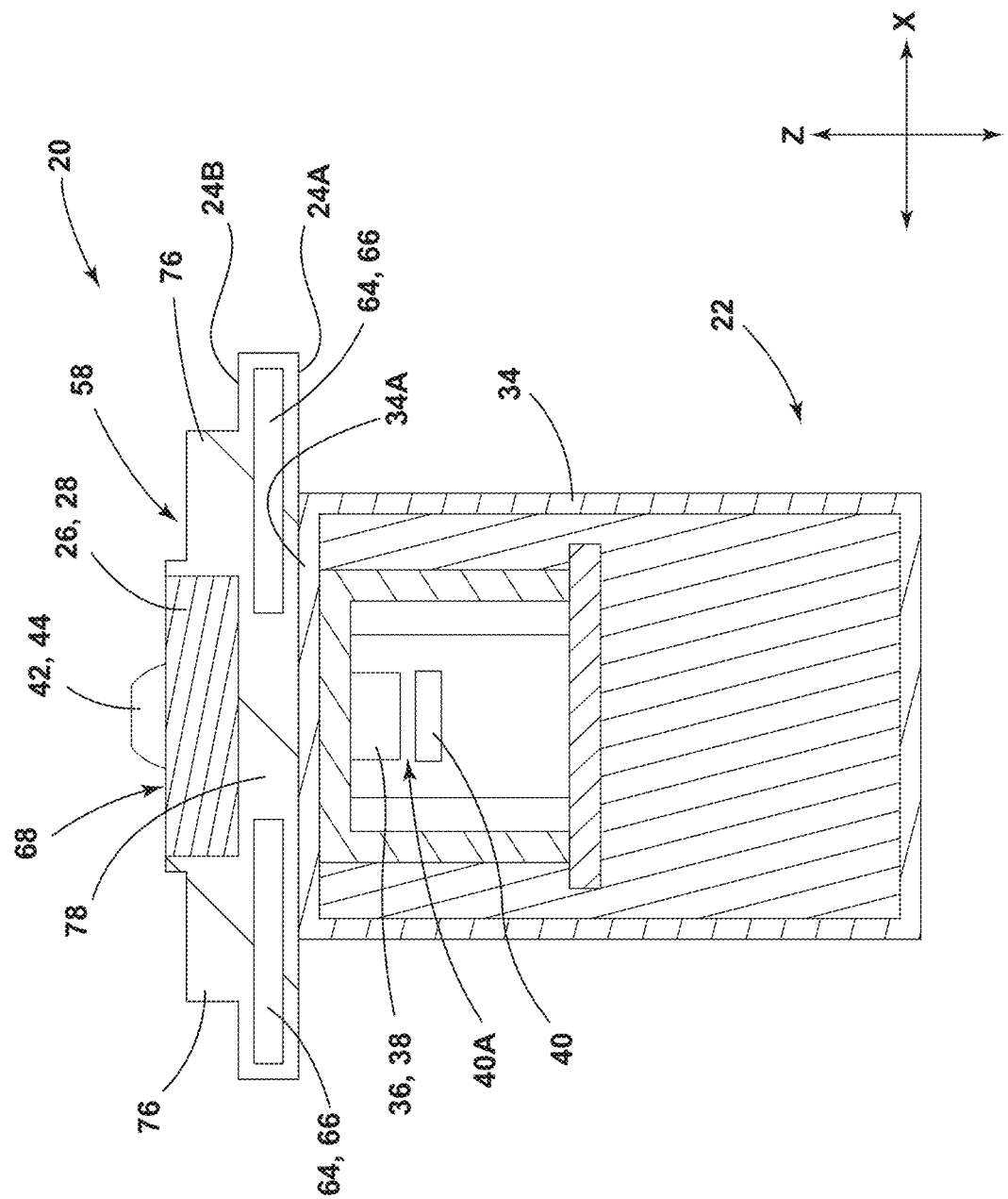

With embodiments, such as generally illustrated in FIGS. 3 and 4, a contactor 22 may include a housing member 34, a first terminal 36, a second terminal 38, and/or a contact member 40. The first terminal 36 may be connected to the first bus bar 26, such as via a first fastener 42 (e.g., a screw, a bolt, etc.). The first terminal 36 may be disposed partially in the housing member 34, partially in the cooling member 24, and/or in contact with the first bus bar 26. The first terminal 36 may extend substantially in a Z-direction. For example and without limitation, the first terminal 36 may extend at least partially below the first fastener 42 and/or the first bus bar 26. The second terminal 38 may be connected to the second bus bar 28, such as via a second fastener 44. The second terminal 38 may be disposed partially in the housing member 34, partially in the cooling member 24, and/or in contact with the second bus bar 28. The second terminal 38 may extend substantially in a Z-direction. For example and without limitation, the second terminal 38 may extend at least partially below the second fastener 44 and/or the second bus bar 28. The first terminal 36 and/or the second terminal 38 may extend into and/or through a wall 34A (e.g., a top wall) of the housing member 34.

In embodiments, the contact member 40 may include one or more of a variety of shapes, sizes, and/or configurations. For example and without limitation, the contact member 40 may extend substantially in a Y-direction and/or the contact member 40 may be substantially planar and/or rectangular. The contact member 40 may be configured to selectively electrically connect the first terminal 36 and the second terminal 38. For example and without limitation, in a first position of the contact member 40, the contact member 40 may be in contact with and electrically connect the first terminal 36 and the second terminal 38 (see, e.g., FIG. 3) and, in a second/open position of the contact member 40, the contact member 40 may not be in contact with and may not electrically connect the first terminal 36 and the second terminal 38 (see, e.g., FIG. 4). In the first position (e.g., a connected or closed position) of the contact member 40, electrical current may flow from the first bus bar 26 to the first terminal 36 (at least some current may flow from the first bus bar 26 to the first fastener 42 to the first terminal 36), from the first terminal 36 to the contact member 40, from the contact member 40 to the second terminal 38, and/or from the second terminal 38 to the second bus bar 28 (at least some current may flow from the second terminal 38 to the second fastener 44 to the second bus bar 28). Current may flow in the opposite direction through the same or a similar path.

In embodiments, the contact member 40 may be configured to move in one or more directions when moving between the first position to the second position. For example and without limitation, the contact member 40 may move in a Z-direction (downwards) from the first position to the second position to electrically disconnect the first bus bar 26 and the second bus bar 28. The contact member 40 may disconnect from the first terminal 36 and the second terminal 38 at substantially the same time. The contact member 40 may move in the Z-direction (upwards) from the second position to the first position to electrically connect the first bus bar 26 and the second bus bar 28. The contact member 40 may connect the first terminal 36 to the second terminal 38 at substantially the same time. The contact member 40 may be configured to contact a bottom surface of the first terminal 36 and/or a bottom surface of the second terminal 38. When the contact member 40 is in the first position, the contact member 40 may be in contact with the bottom surface of the first terminal 36 and the bottom surface of the second terminal 38. When the contact member 40 is in the second position, the contact member 40 may be in contact with either the bottom surface of the first terminal 36 or the bottom surface of the second terminal 38. Additionally or alternatively, when the contact member 40 is in the second position, the contact member 40 may not be in contact with either of the first terminal 36 and the second terminal 38. In the second position of the contact member 40, a gap 40A may be disposed between the contact member 40 and the first terminal 36 and the second terminal 38. The size of the gap 40A between (e.g., in the Z-direction) the terminals 36, 38 and the contact member 40 may be sufficient to limit and/or prevent arcing between the first terminal 36, the second terminal 38, and/or the contact member 40.

In embodiments, the housing member 34 of the contactor 22 may include one or more of a variety of shapes, sizes, configurations, and/or materials. For example and without limitation, the housing member 34 may be generally rectangular and may comprise an electrically insulating material. The contact member 40 may be disposed within the housing member 34. The housing member 34 may include a first flange 46 and/or a second flange 48. The first flange 46 and the second flange 48 may extend generally perpendicular from the housing member 34 and/or may extend from opposite sides of the housing member 34, such as in opposite Y-directions (see, e.g., FIG. 3). The flanges 46, 48 may, for example, be substantially parallel to an X-Y plane.

With embodiments, the first flange 46 and/or the second flange 48 may be configured to connect the cooling member 24 to the housing member 34. The first flange 46 and/or the second flange 48 may include a first aperture 50 and/or a second aperture 52, respectively. For example and without limitation, the first aperture 50 and/or the second aperture 52 may be configured to at least partially receive a third fastener 54 and/or a fourth fastener 56, respectively. The third fastener 54 and/or the fourth fastener 56 may be configured to engage the cooling member 24 substantially in the Z-direction. For example and without limitation, the third fastener 54 and/or the fourth fastener 56 may vertically engage (e.g., screw into) mounting portions 60, 62 of the cooling member 24 to connect the housing member 34 with the cooling member 24. The third fastener 54 and/or the fourth fastener 56 may cooperate with the first flange 46 and/or the second flange 48 to limit movement of the cooling member 24 with respect to the housing member 34 in at least one direction. The housing member 34 may or may not include additional flanges and/or fasteners to further limit movement of the cooling member 24 with respect to the housing member 34.

With embodiments, a cooling member 24 may include one or more of a variety of shapes, sizes, configurations, and/or materials. For example and without limitation, a cooling member 24 may include a generally rectangular body 58, a first mounting portion 60 that may be substantially cylindrical, and/or a second mounting portion 62 that may be substantially cylindrical (see, e.g., FIGS. 3, 5, 6). The body 58 may be substantially parallel with an X-Y plane. The body 58 may be longer (e.g., in the Y-direction) and/or wider (e.g., in the X-direction) than the housing member 34, such that the cooling member 24 may extend beyond one, some, or all sides of the housing member 34. The first mounting portion 60 and/or the second mounting portion 62 may extend in a Z-direction (e.g., may extend substantially downward). The body 58, the first mounting portion 60, and the second mounting portion 62 may be disposed in a generally C-shaped configuration.

In embodiments, the body 58 may be substantially hollow and/or may be configured to receive a cooling fluid (e.g., air, a liquid coolant, such as glycol, etc.). The body 58 may include a first open side 64 that may be open in a first Y-direction, and/or may include a second open side 66 that may be open in a second, opposite Y-direction (e.g., an aperture may extend from the first open side 64 to the second open side 66 of the cooling member 24). The first mounting portion 60 and/or the second mounting portion 62 may extend from a first/bottom side 24A of the cooling member 24, such as in a Z-direction. The first mounting portion 60 may be connected with the first flange 46 of the housing member 34, such as via the third fastener 54 (e.g., the first mounting portion 60 may include internal threads). The second mounting portion 62 may be connected with the second flange 48, such as via a fourth fastener 56 (e.g., the second mounting portion 62 may include internal threads). The mounting portions 60, 62 may provide a mechanical/physical connection between the contactor 22 and the cooling member 24, and the mounting portions 60, 62 may not provide an electrical connection between the contactor 22 and the cooling member 24.

In embodiments, a second/top side 24B of the cooling member 24 may include a recess 68 that may be configured to at least partially receive the first bus bar 26 and/or the second bus bar 28. The recess 68 may extend in a Y-direction and may be formed via a first protrusion 70 and/or a second protrusion 72 that may extend from the second side 24B of the cooling member 24/body 58, such as in a Z-direction (e.g., vertically upward). The protrusions 70, 72 may include one or more of a variety of shape, sizes, and/or configurations. For example and without limitation, the protrusions 70, 72 may be substantially planar and/or rectangular. The protrusions 70, 72 may, for example, be substantially parallel to a Y-Z plane. The first bus bar 26 and the second bus bar 28 may be disposed end-to-end and at a distance from each other in the recess 68. For example and without limitation, a first end 26A of the first bus bar 26 may be disposed in a first portion 68A of the recess 68 and may be proximate a first end 28A of the second bus bar 28 that may be disposed in a second portion 68B of the recess 68. The first end 26A of the first bus bar 26 may not be in contact with the first end 28A of the second bus bar 28. The first ends 26A, 28A of the bus bars 26, 28 may be separated by a barrier 74 that may include material that may be electrically insulating and/or thermally conductive. The barrier 74 may, for example and without limitation, not be wider (e.g., in the Y-direction) than a thickness (e.g., in the Z-direction) of the first bus bar 26 and/or the second bus bar 28.

With embodiments, the body 58 of the cooling member 24 may include one or more fins 76 that may generally extend in an X-direction and/or may be substantially parallel with an X-Z plane. The fins 76 may include one or more of a variety of shapes, sizes, and/or configurations. For example and without limitation, the fins 76 may be substantially planar and/or rectangular. The fins 76 may extend (e.g., substantially perpendicular) from the second side 24B of the cooling member 24/body 58, from the first protrusion 70, and/or from the second protrusion 72. The fins 76 may be disposed on the second side 24B of the cooling member 24/body 58 in an array (e.g., the fins 76 may be substantially parallel to each other). Any number of fins 76 may be included on the body 58. The fins 76 may be configured to facilitate convection and/or heat dissipation, such as via external/ambient air (e.g., as opposed to or in addition to via fluid coolant flowing through the cooling member 24). For example and without limitation, the number of fins 76 extending from the body 58 may be increased and/or decreased to increase and/or decrease heat dissipation. For bus bars 26, 28 that may be configured for higher voltages and/or currents, the number of fins 76 may be increased; and/or for bus bars 26, 28 that may be configured for lower voltages and/or currents, the number of fins 76 may be decreased. Additionally or alternatively, a height/length of the fins 76 may be increased and/or decreased to increase and/or decrease heat dissipation, respectively.

Figure 5:
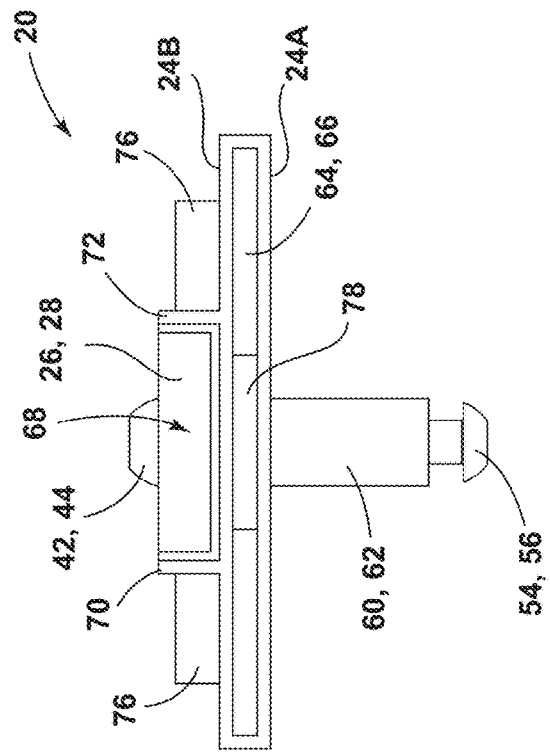
FIGS. 5, 6, and 7 are a side view, a perspective view, and a cross-sectional perspective view, respectively, generally illustrating embodiments of cooling members and bus bars according to teachings of the present disclosure.
Figure 6:
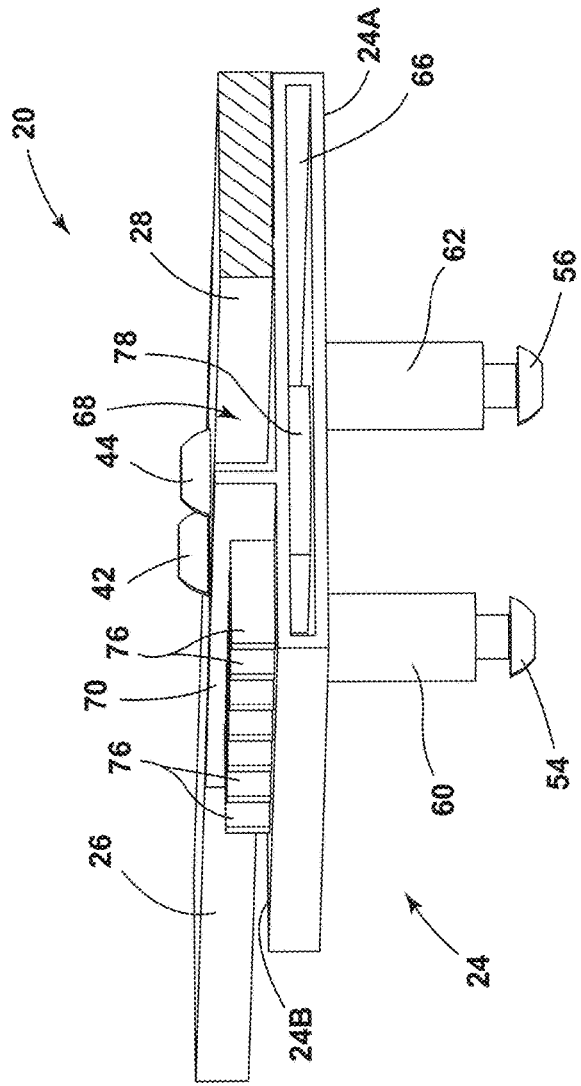
Figure 7:
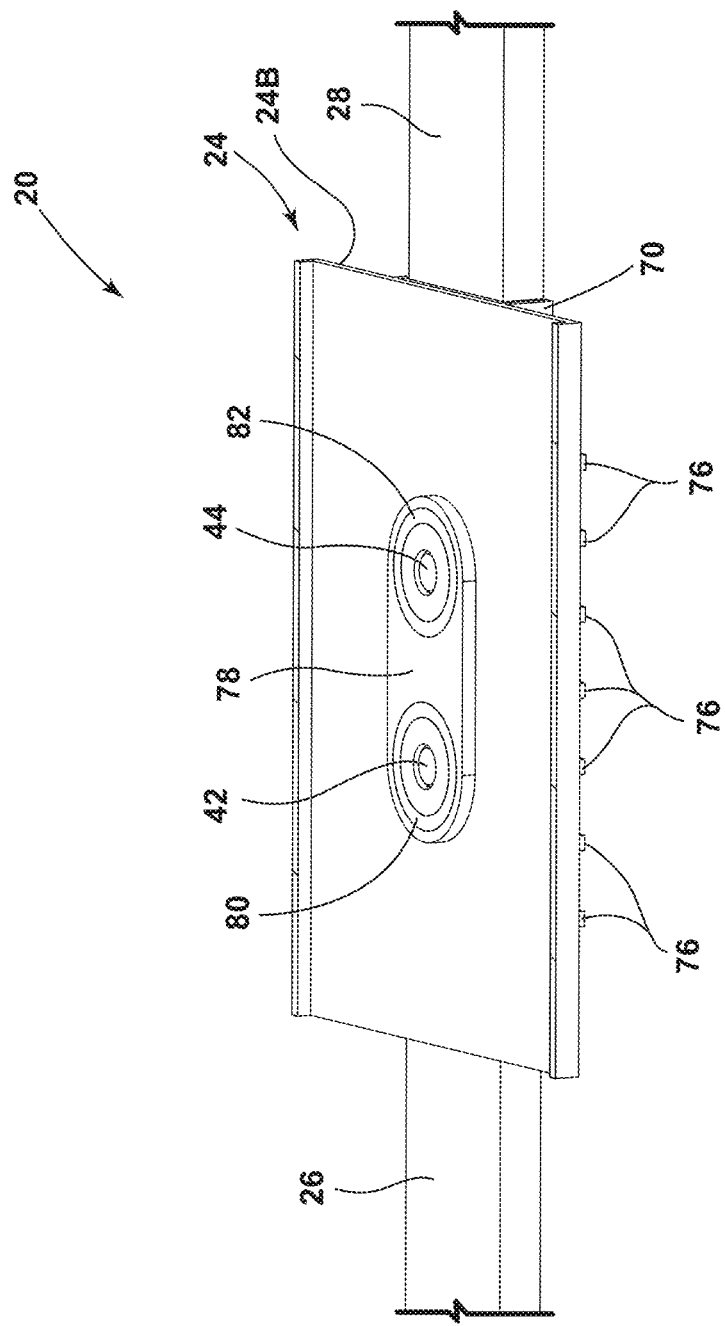

With embodiments, such as generally illustrated in FIGS. 5, 6, and 7, a cooling member 24 may include a middle portion 78. The middle portion 78 may extend from the first/bottom side 24A to the second/top side 24B. The middle portion 78 may include a first aperture 80 and/or a second aperture 82, and may otherwise be solid (e.g., as opposed to a remainder of the body 58 that may be hollow), such as generally illustrated in FIG. 7. The middle portion 78 may, for example and without limitation, include an oblong configuration. The first aperture 80 may be configured to at least partially receive the first terminal 36 and/or the first fastener 42. The second aperture 82 may be configured to at least partially receive the second terminal 38 and/or the second fastener 44. For example and without limitation, the first terminal 36 may be partially disposed in the first aperture 80, the second terminal 38 may be partially disposed in the second aperture 82, and a portion of the middle portion 78 may be disposed between (i) the first aperture 80, the first terminal 36, and/or the first fastener 42, and (ii) the second aperture 82, the second terminal 38, and/or the second fastener 44 (e.g., in a Y-direction).

Figure 8:
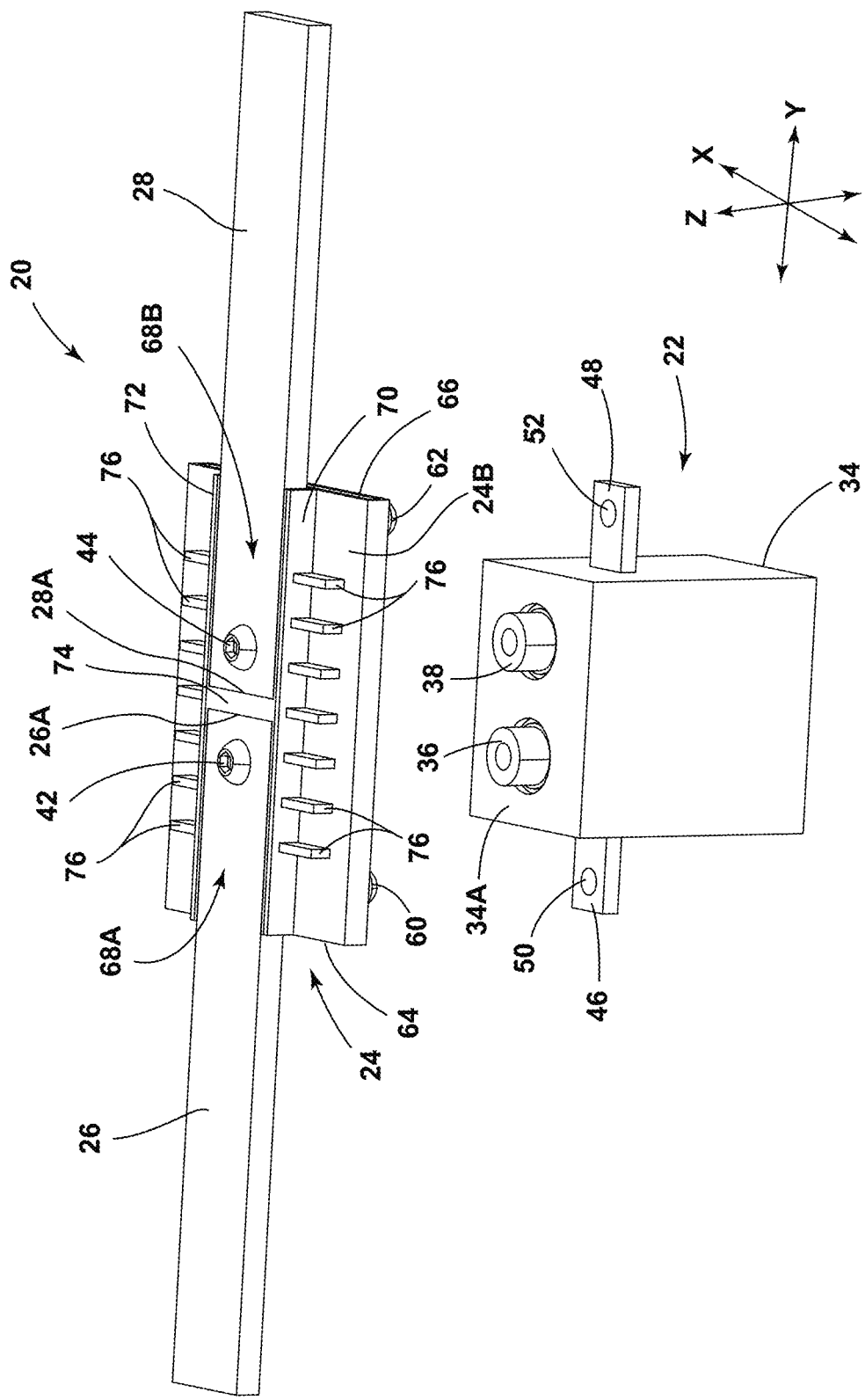
FIG. 8 is an exploded perspective view generally illustrating an embodiment of an electrical unit according to teachings of the present disclosure.
Figure 9:
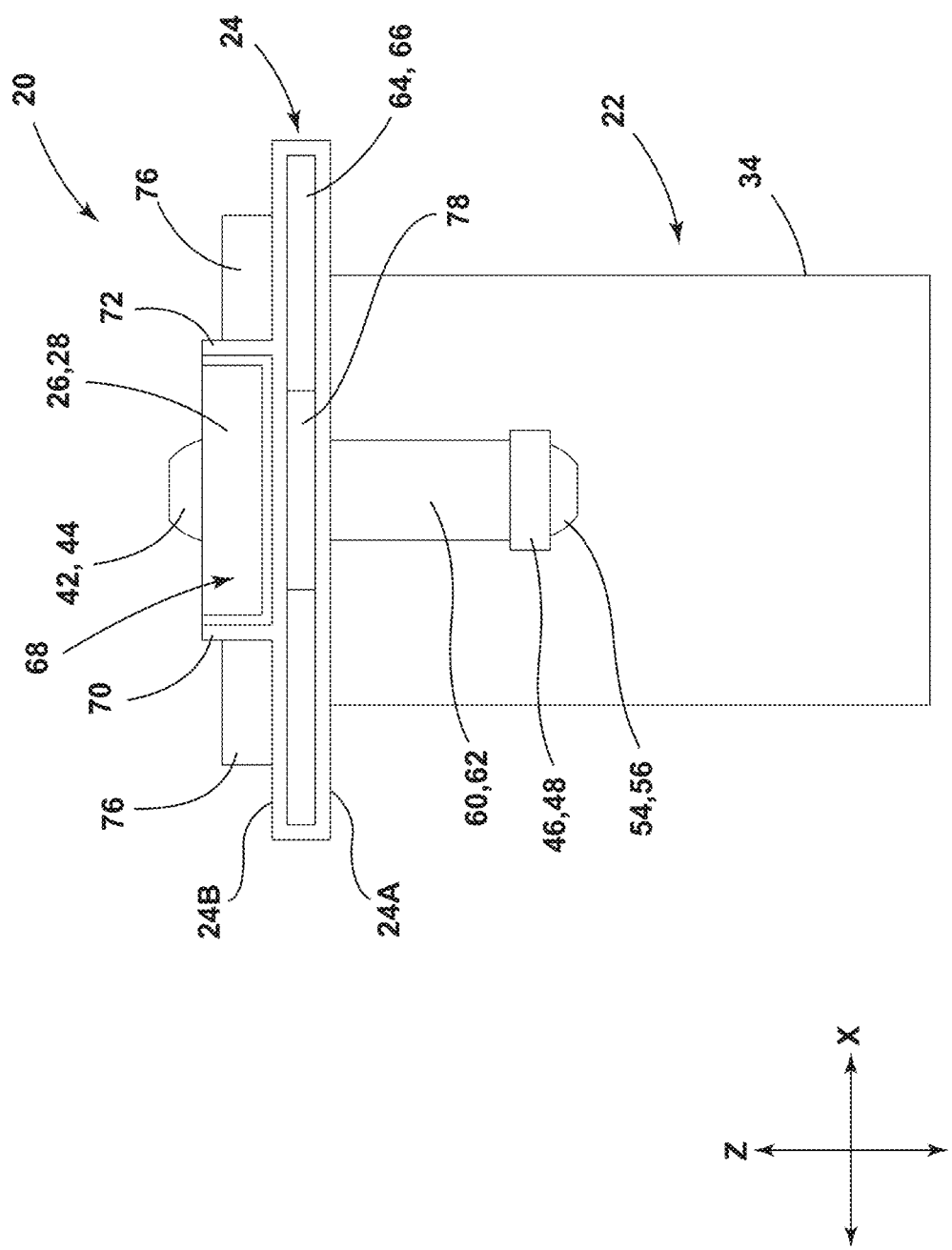
FIGS. 9, 10, and 11 are side, top, and bottom views, respectively, generally illustrating embodiments of electrical units according to teachings of the present disclosure.
Figure 10:
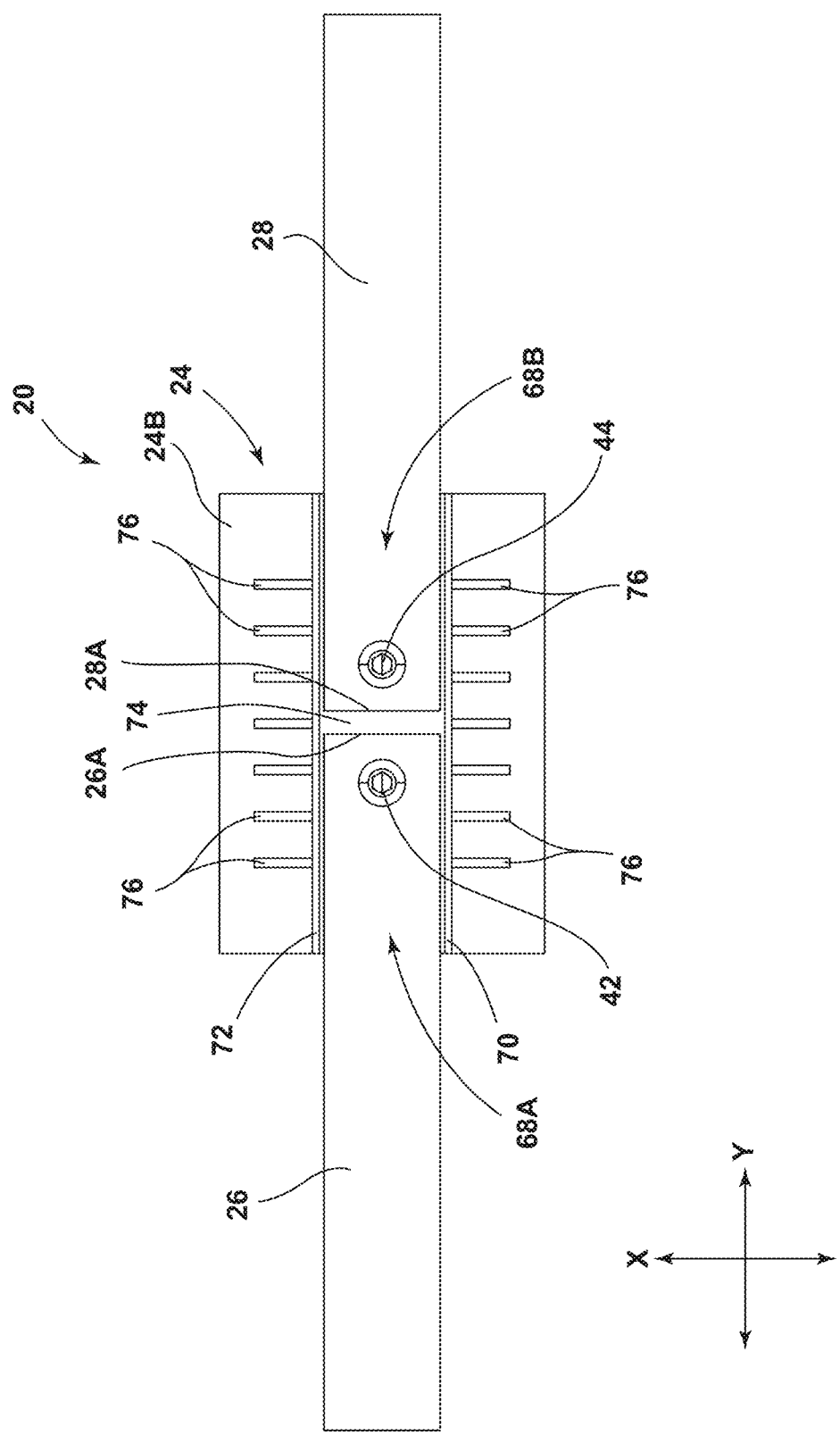
Figure 11:
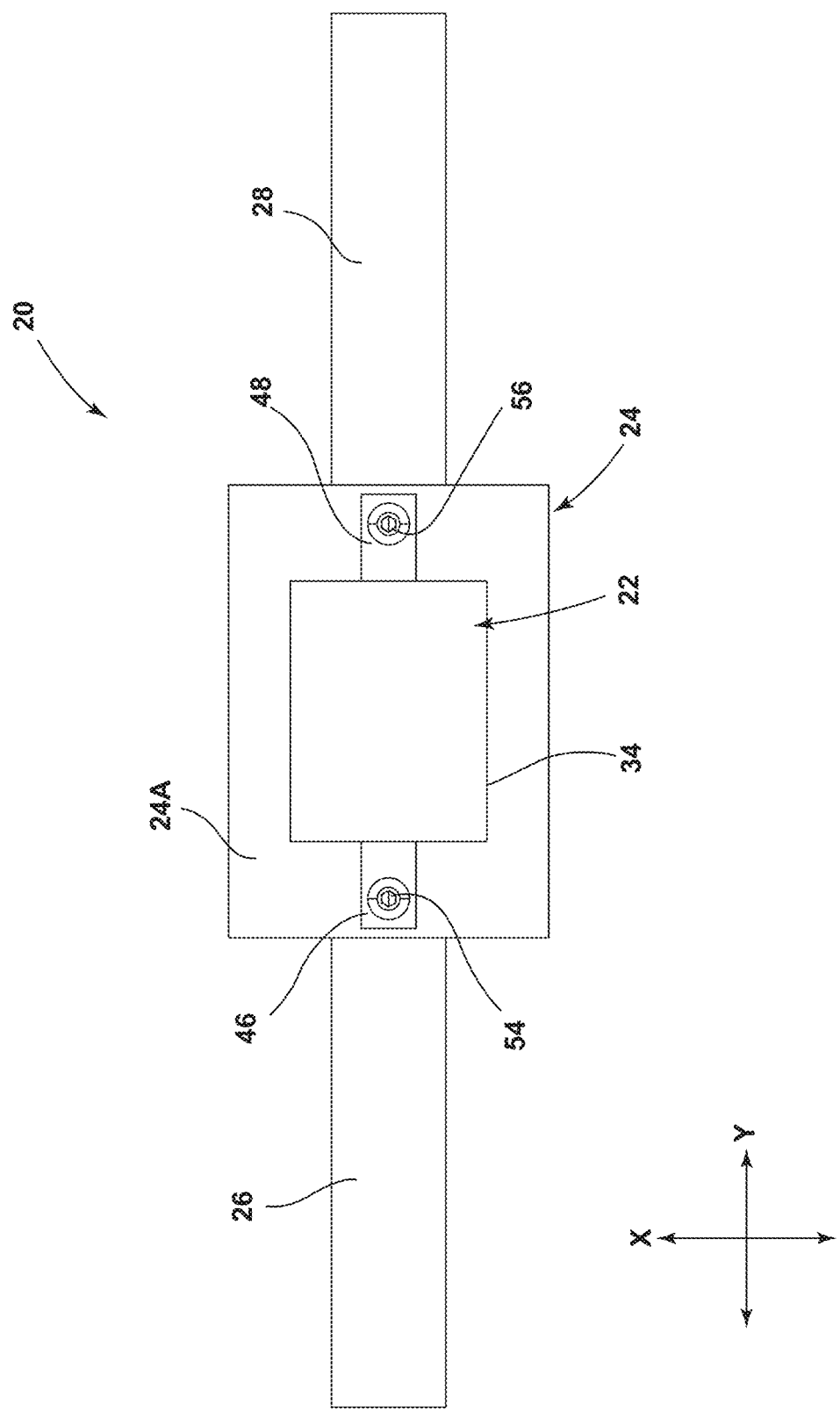

With embodiments, such as generally illustrated in FIGS. 3, 4, and 8, a cooling member 24 may be disposed directly on a side/wall 34A (e.g., a top side) of the housing member 34. A section or sections 24C of the cooling member 24 may be disposed between (e.g., directly between in a Z-direction) the first bus bar 26 and the housing member 34 and/or between the second bus bar 28 and the housing member 34 (see, e.g., FIG. 3). For example and without limitation, the housing member 34, the cooling member 24, and the first bus bar 26 may overlap in a Z-direction, and/or the housing member 34, the cooling member 24, and the second bus bar 28 may overlap in a Z-direction. The cooling member 24 may be configured to facilitate reduction of the overall temperature of the electrical unit 20. The cooling member 24 may be disposed substantially between the bus bars 26, 28 and the housing member 34. The cooling member 24 may be configured to facilitate reduction of the overall temperature of the electrical unit 20 in one or more of a variety of ways. For example and without limitation, air may circulate about a perimeter of the electrical unit 20 (including the cooling member 24) to dissipate heat from the electrical unit 20, and/or fluid may circulate within/through the cooling member 24 to dissipate heat from the electrical unit 20.

In embodiments, the cooling member 24 may be electrically insulated from the first bus bar 26, the second bus bar 28, the first terminal 36, and/or the second terminal 38. For example and without limitation, an electrically insulating and thermally conductive material (TIM) 84 may be disposed at least partially between the (i) the cooling member 24, and (ii) the first bus bar 26, the second bus bar 28, the first terminal 36, and/or the second terminal 38.

With embodiments, the cooling member 24 may be a monolithic component (e.g., a single, unitary component). For example and without limitation, the body 58, the first mounting portion 60, and the second mounting portion 62 may be integrally formed as a monolithic component.

In embodiments, the contactor 22 (which may include the first terminal 36, the second terminal 38, and the contact member 40), the first fastener 42, the second fastener 44, the first bus bar 26, and/or the second bus bar 28 may be configured for a continuous electrical current of at least 400 amps. The cooling member 24 may be disposed substantially adjacent to (e.g., with material 84 in between) one or more of the first bus bar 26, the second bus bar 28, the first terminal 36, the second terminal 38, and/or the housing member 34, which may facilitate dissipating heat that may be generated via high electrical currents. The greatest amount of heat generated may be at or about the contact member 40. A distance (e.g., in a Z-direction) between the contact member 40 (in a closed position) and the cooling member 24 may be less than about 50%, less than about 25%, and/or about 15% of a height (e.g., in the Z-direction) of the housing member 34.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," "an embodiment," "in examples," "with examples," or the like, means that a particular feature, structure, or characteristic described in connection with the embodiment/example is included in at least one embodiment/example. Thus, appearances of the phrases "in various embodiments," "with embodiments," "in embodiments," "an embodiment," "in examples," "with examples," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

What is claimed is:

1. An electrical unit, comprising:
  a contactor including:
    a housing member;
    a first terminal;
    a second terminal; and
    a contact member disposed in the housing member and configured to selectively electrically connect the first terminal and the second terminal;
  a cooling member connected to the housing member;
  a first bus bar connected to the cooling member and the first terminal; and
  a second bus bar connected to the cooling member and the second terminal;
  wherein the cooling member is configured to dissipate heat that is generated via electrical current flowing through the contact member; and
  a first end of the first bus bar is separated from a first end of the second bus bar by a barrier of electrically insulating and thermally conductive material.

2. The electrical unit of claim 1, wherein the cooling member is attached to and in direct contact with the housing member.

3. The electrical unit of claim 2, wherein a section of the cooling member is disposed between the first bus bar and the housing member.

4. The electrical unit of claim 1, wherein the cooling member includes a first mounting portion connected to a first flange of the housing member.

5. The electrical unit of claim 4, wherein the cooling member includes a second mounting portion connected to a second flange of the housing member; and the first flange and the second flange extend from opposite sides of the housing member; the first terminal is connected to the first bus bar via a first fastener; the second terminal is connected to the second bus bar via a second fastener; the first mounting portion is connected to the first flange via a third fastener; and the second mounting portion is connected to the second flange via a fourth fastener.

6. The electrical unit of claim 1, wherein a portion of the first terminal is disposed in the cooling member and is electrically insulated from the cooling member.

7. The electrical unit of claim 1, wherein the first terminal is disposed in contact with the first bus bar; the second terminal is disposed partially in the housing member and partially in the cooling member; and the second terminal is disposed in contact with the second bus bar.

8. The electrical unit of claim 1, wherein a body of the cooling member is disposed directly on a side of the housing member.

9. The electrical unit of claim 8, wherein the first terminal and the second terminal extend through a wall of the housing member.

10. The electrical unit of claim 1, wherein the cooling member is a monolithic component.

11. The electrical unit of claim 10, wherein a width of the cooling member is greater than a width of the housing member; and a length of the cooling member is greater than a length of the housing member.

12. The electrical unit of claim 1, wherein the cooling member includes a first aperture and a second aperture; the first terminal is disposed partially in the first aperture; and the second terminal is disposed partially in the second aperture.

13. The electrical unit of claim 1, wherein the cooling member includes a recess; the first bus bar is disposed partially in a first portion of the recess; and the second bus bar is disposed partially in a second portion of the recess.

14. The electrical unit of claim 1, wherein a width of the barrier is not greater than a thickness of the first bus bar.

15. The electrical unit of claim 1, wherein a portion of the cooling member is disposed substantially between the first terminal and the second terminal.

16. The electrical unit of claim 1, wherein the cooling member includes at least one fin configured for heat dissipation.

17. An electrical unit, comprising:
a contactor including:
a housing member;
a first terminal;
a second terminal; and
a contact member configured to selectively electrically connect the first terminal and the second terminal;
a cooling member;
a first bus bar connected to the cooling member and the first terminal;
a second bus bar connected to the cooling member and the second terminal; and
wherein the first terminal is disposed partially in the housing member and partially in the cooling member.

18. The electrical unit of claim 17, wherein a first end of the first bus bar is separated from a first end of the second bus bar by a barrier of electrically insulating and thermally conductive material.

19. An electrical unit, comprising:
a contactor including: a housing member;
a first terminal;
a second terminal; and
a contact member disposed in the housing member configured to selectively electrically connect the first terminal and the second terminal;
a cooling member;
a first bus bar connected to the cooling member and the first terminal;
a second bus bar connected to the cooling member and the second terminal; and
wherein the cooling member includes a body, a first mounting portion, and a second mounting portion; and the body, the first mounting portion, and the second mounting portion are disposed in a substantially C-shaped configuration.

20. The electrical unit of claim 19, wherein the cooling member is electrically insulated from the first bus bar, the second bus bar, the first terminal, and the second terminal.

* * * * *